(12) United States Patent
Busch

(10) Patent No.: US 8,018,719 B2
(45) Date of Patent: Sep. 13, 2011

(54) VAPOR CHAMBER HEAT SINK WITH CROSS MEMBER AND PROTRUDING BOSS

(75) Inventor: Diane S. Busch, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 12/471,625

(22) Filed: May 26, 2009

(65) Prior Publication Data
US 2010/0302725 A1 Dec. 2, 2010

(51) Int. Cl.
*H05K 5/00* (2006.01)
*F28D 15/00* (2006.01)
*H05K 7/20* (2006.01)
*H01L 23/34* (2006.01)

(52) U.S. Cl. ............ 361/700; 361/679.52; 361/679.53; 361/679.47; 165/80.4; 165/104.33; 174/15.2; 257/714; 257/719

(58) Field of Classification Search ............ 361/679.52, 361/679.53, 679.47, 699, 700; 165/80.4–80.3, 165/104.33; 174/15.1–15.2, 252; 257/714–715, 257/718–719
See application file for complete search history.

(56) References Cited

U.S. PATENT DOCUMENTS

| | | | |
|---|---|---|---|
| 5,006,924 A * | 4/1991 | Frankeny et al. ............. 257/714 |
| 5,323,292 A * | 6/1994 | Brzezinski .................... 361/689 |
| 5,694,295 A | 12/1997 | Mochizuki et al. |
| 5,940,271 A | 8/1999 | Mertol |
| 6,082,443 A * | 7/2000 | Yamamoto et al. ...... 165/104.26 |
| 6,212,074 B1 * | 4/2001 | Gonsalves et al. ............ 361/717 |
| 6,695,042 B1 | 2/2004 | Boudreaux et al. |
| 7,006,354 B2 | 2/2006 | Mochizuki et al. |
| 7,100,680 B2 | 9/2006 | Dussinger et al. |
| 7,342,306 B2 * | 3/2008 | Colbert et al. ................ 257/712 |
| 7,435,622 B2 * | 10/2008 | Colbert et al. ................ 438/118 |
| 7,599,185 B2 * | 10/2009 | Meyer et al. .................. 361/700 |
| 2007/0012429 A1 * | 1/2007 | Siu ........................... 165/104.33 |
| 2008/0041565 A1 * | 2/2008 | Yang et al. ............... 165/104.26 |
| 2008/0053640 A1 | 3/2008 | Mok |
| 2008/0106868 A1 * | 5/2008 | Hoss et al. .................... 361/704 |
| 2009/0242169 A1 * | 10/2009 | Meyer et al. ................. 165/80.3 |
| 2009/0310296 A1 * | 12/2009 | Peng et al. ............... 361/679.49 |

* cited by examiner

*Primary Examiner* — Zachary M Pape
(74) *Attorney, Agent, or Firm* — Cynthia G. Seal; Jeffrey L. Streets

(57) ABSTRACT

One embodiment provides a vapor chamber having an outwardly protruding boss. A frame surrounds a perimeter of the vapor chamber. A plurality of heat sink fins extend from the frame. A cross-member spans the frame across the vapor chamber wall and defines an opening through which the boss protrudes at least slightly beyond the cross-member. The heat sink may be secured to a socket on a circuit board, with the boss engaging a processor positioned in the socket. In response to securing the heat sink, the boss compresses flush with the cross-member and the cross-member engages the processor to seat the processor in the socket. The opening in the cross-member reinforces the boss against outward deformation.

17 Claims, 2 Drawing Sheets

VAPOR CHAMBER HEAT SINK WITH CROSS MEMBER AND PROTRUDING BOSS

BACKGROUND OF THE INVENTION

1. Field of the Invention

The present invention relates to heat sinks, and more specifically to an improved vapor chamber heat sink that secures a component being cooled.

2. Background of the Related Art

Electronic components generate heat as a result of consuming electrical energy. A prime example of a heat-generating electronic component is a processor in a computer system, such as a central processing unit (CPU). A CPU directly accesses and executes software instructions from volatile memory, e.g. RAM (random access memory) or DRAM (dynamic random access memory). CPUs generate a considerable amount of heat as a result of performing numerous, extremely high-speed operations required for executing computer programs. The computer industry is continually innovating cooling systems specific to the unique and demanding cooling requirements of CPUs.

A heat sink is commonly used to cool a CPU. Generally, a heat sink conducts heat away from a CPU, and has cooling fins that provide a large surface area for airflow to efficiently remove the heat by convection. A variety of heat sink designs are known in the art, some of which incorporate a vapor chamber to improve cooling. A vapor chamber is a sealed vessel containing fluid that vaporizes in the vicinity of the hot component. The vapor migrates to a cooler surface of the vapor chamber, where it condenses and returns to the vicinity of the hot component. This vaporization and condensation cycle improves heat transfer from the hot component to the heat sink. For the purpose of this disclosure, a vapor chamber is defined to include a heat pipe as a particular type of vapor chamber.

Conventionally, a CPU is mounted in a connector known as a socket that is mounted to the system board. During assembly, the socket is soldered to the system board, and the processor is positioned in the socket, often as part of a CPU package that includes the processor and a substrate. A secondary retention structure is used to retain the processor within the socket. One example of a secondary retention structure is an Independent Loading Mechanism (ILM), offered by Intel®. The ILM resembles a picture frame hinged to one side of the socket. The ILM captures the processor, and a lever is used to urge the processor into electrical contact with the socket and to hold the processor securely within the socket. With the processor mounted, the heat sink is then secured to the system board over the ILM. The cooperating heat sink and ILM are subject to the mechanical design limitations imposed by one on the other. For example, the heat sink must be designed to account for the extra space required by the ILM, even though doing so may compromise the cooling capacity of the heat sink.

BRIEF SUMMARY OF THE INVENTION

One embodiment of the present invention provides a heat sink assembly. A vapor chamber has a vapor chamber wall defining a closed volume for containing a volatile liquid. The vapor chamber wall includes an outwardly protruding boss. A frame surrounds a perimeter of the vapor chamber. A plurality of heat sink fins extend from the frame. A cross-member structurally secured to the frame spans the frame across the vapor chamber wall. The cross-member defines an opening through which the boss protrudes at least slightly beyond the cross-member. The boss is compressible flush with the cross-member without rupturing.

In one method of use, the heat sink assembly may be used to cool a processor disposed in a socket by securing the heat sink to the socket with the boss in contact with the processor. The boss compresses against the processor until flush with the cross-member, and the cross-member applies some of the force to seat and retain the processor in the socket.

DETAILED DESCRIPTION OF THE INVENTION

One embodiment of the present invention is a vapor-chamber heat sink assembly that includes a frame surrounding the perimeter of a vapor chamber. The vapor chamber has a vapor chamber wall defining a closed volume for containing a volatile liquid. The vapor chamber wall also includes an outwardly protruding boss. A structural cross-member is secured to the frame across an exterior surface of the vapor chamber and has a window that receives and conforms closely to the profile of the boss. The boss protrudes through the window for engagement with a processor to be cooled. One or more fasteners, such as spring-loaded screws, are used to secure the heat sink assembly to the system board, with the boss directly thermally contacting the processor for thermal conduction from the processor to the vapor chamber. The boss compresses against the processor under the force provided by the spring-loaded fastening system so that the structural cross-member engages the processor to firmly retain the processor within the socket without an Independent Loading Mechanism (ILM).

Figure 1:
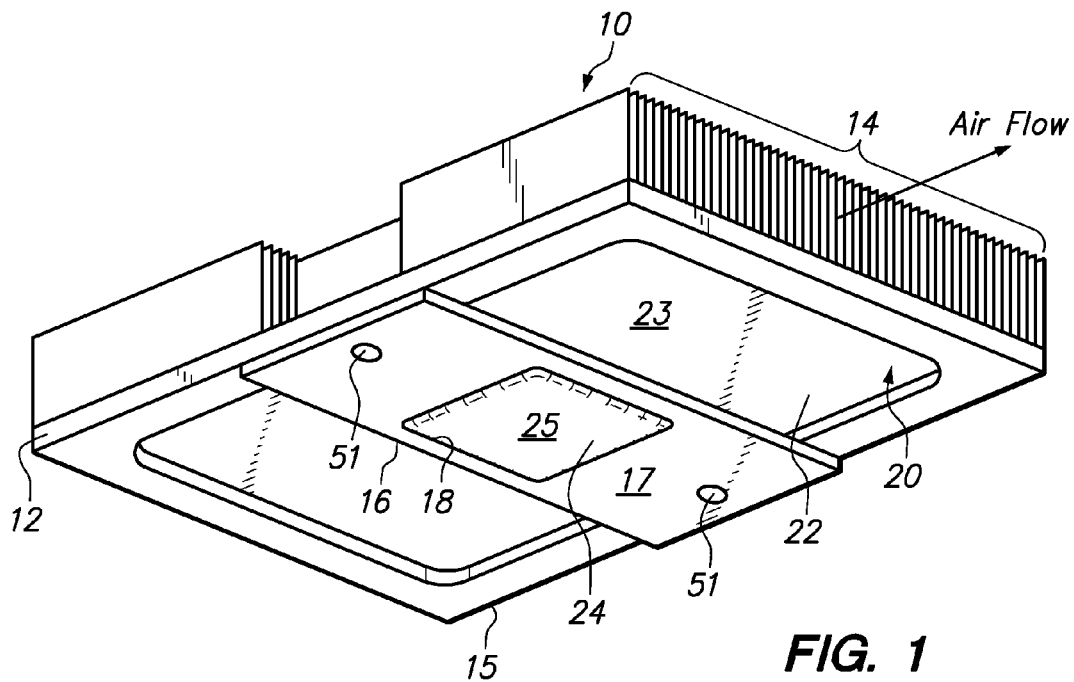
FIG. 1 is a perspective view of a heat sink assembly according to one embodiment of the invention.

FIG. 1 is a perspective view of a heat sink assembly 10 according to one embodiment of the invention. The heat sink assembly 10 includes a plurality of fins 14 secured to a frame 12. The frame 12 receives a vapor chamber 20, with the frame 12 closely surrounding a perimeter of the vapor chamber 20. The vapor chamber 20 has an outer wall 22 that defines a sealed, enclosed space containing a volatile liquid. The outer wall 22 of the vapor chamber 20 is also typically very thin-walled, to maximize thermal conductivity through the outer wall 22 to the volatile liquid contained within the vapor chamber 20. The fins 14 and the frame 12 may be formed in one piece, such as by casting the frame 12 and fins 14 together in a mold or by machining a block of material such as aluminum to form the frame 12 and fins 14 together. The vapor chamber 20 directly contacts an interior surface of the frame 12 and/or the fins 14 to ensure thermal conduction from the vapor chamber 20 to the fins 14. Preferably, the frame 12 includes a thin top plate (not shown) having a first surface to which the fins are directly connected and a second surface that is in direct contact with the vapor chamber. The fins 14 conduct heat away from the vapor chamber 20 through the top plate, and airflow from a fan or blower may be directed between the fins 14 to remove heat from the fins 14 by forced convection.

The frame 12 and fins 14 are made of a first material, such as aluminum, having good thermal conductivity and providing structural integrity to the overall heat sink assembly 10. The vapor chamber 20 may be made of a second material, such as copper, which has excellent thermal conductivity but less stiffness and strength than aluminum. As a consequence, the thin-walled vapor chamber 20 may be fragile. The relatively strong and stiff aluminum frame 12 surrounds and protects the comparatively fragile copper vapor chamber 20. It should be noted, however, that aluminum is given as just one example of a suitable material for the frame 12 and fins 14 and copper is given as just one example of a suitable material for the vapor chamber. More generally, the material for the frame, fins, and vapor chamber may be selected so that the material of the frame and fins has greater strength and stiffness (for example at least twice the strength and twice the stiffness) than the material of the vapor chamber.

The outer wall 22 of the vapor chamber 20 has a lower (relative to the illustrated orientation) exterior surface 23. A centrally-located boss 24 extends outwardly beyond the surrounding portion of the lower, exterior surface 23 for contacting a processor to be cooled. A structural cross-member 16 is secured to a lower edge 15 of the frame 12 and spans the lower, exterior surface 23 of the vapor chamber 20, such that the cross-member is on the opposite side of the vapor chamber from the fins. The frame 12 and structural cross-member 16 are components of a "stiffening pedestal." The lower edge 15 of the frame 12 optionally extends slightly past the lower, exterior surface 23 of the vapor chamber 20. The structural cross-member 16 has an opening, which in this embodiment is a window 18 through the cross-member that closely receives the boss 24 and fully surrounds a perimeter of the boss 24. The lower surface 17 of the cross-member and the surface 25 of the boss 24 are oriented and facing in the same direction. The lower surface 17 of the cross-member 16 and the surface 25 of the boss 24 are substantially parallel in this embodiment, although neither the surface 25 of the boss 24 nor the lower surface 17 of the cross-member 16 are required to be perfectly planar. The boss 24 protrudes slightly beyond the lower surface 17 of cross-member 16 when the boss 24 is in a relaxed (i.e. uncompressed) condition so that the boss 24 may directly contact a processor on a system board, as described below. Through-holes 51, 55 are provided on the frame 12 and system board 30 for receiving threaded fasteners.

Figure 2:
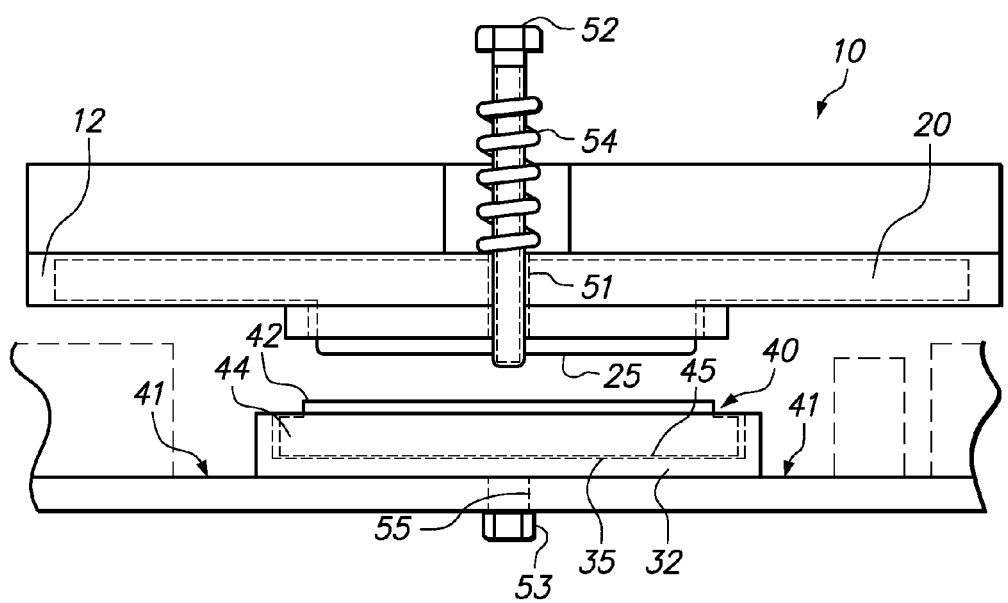
FIG. 2 is a partially-exploded side view of the heat sink assembly positioned for securing to a circuit board in general alignment with a processor.

FIG. 2 is a side view of the heat sink assembly 10 positioned for securing to a circuit board 30 in general alignment with a processor 42. The circuit board 30 in this embodiment is the system board 30 of a computer. A socket 32 has previously been electrically and mechanically coupled to the system board 30, such as by soldering a ball grid array (BGA) to mating electrical contacts (not shown) on the system board 30. A CPU package 40 includes the processor 42 mounted on a substrate 44, as generally known in the art outside the context of the invention. Prior to securing the heat sink assembly 10 to the system board 30, the CPU package 40 has been inserted into the socket 32 loosely, which may be performed with essentially zero insertion force. The CPU package 40 has many electrical contacts as known in the art (not shown) on a lower surface 45 of the substrate 44. The electrical contacts on the lower surface 45 of the substrate 44 are matched to mating electrical contacts on an upwardly facing surface 35 of the socket 32. The lower surface 25 of the boss 24 is aligned for direct contact with the processor 42 as the heat sink assembly 10 is lowered. With the CPU package 40 inserted as shown, however, the CPU package 40 remains unseated so that the electrical contacts on the lower surface 45 of the substrate 44 are not yet fully engaged with the mating electrical contacts on the surface 35 of the socket 32.

A secondary retention structure mounting location is indicated at 41. The secondary retention structure mounting location is conventionally reserved on the system board 30 for a secondary retention structure, such as an ILM. The system board 30 may be an existing system board design that includes the secondary retention structure mounting location 41. Alternatively, the system board 30 may be configured specifically for use in tandem with the heat sink assembly 10 without a secondary retention structure, and may omit the optional secondary retention structure mounting location 41. Securing the heat sink assembly 10 to the system board 30 will seat the CPU package 40 to establish electrical communication with the processor 42 and the socket 32, and retain the CPU package 40 in the socket, without the need for an ILM or other secondary retention structure.

A variety of fastening systems are known in the art for securing a heat sink to a system board, examples of which include spring-loaded threaded fasteners, spring clips, or a clamp. In the embodiment of FIG. 2, a representative spring-loaded fastening system 50 is selected for its ability to generate a relatively high mounting force. The spring-loaded fastening system 50 includes an externally threaded member 52, an internally threaded member 53 that threadably couples with the externally threaded member 52, and a spring 54. The spring 54 is positioned on the externally threaded member 52, which is inserted through the through-hole 51 on the frame 12 and the through-hole 55 on the system board 30 to threadably engage the internally threaded member 53. This example configuration of the spring loaded fastener 50 is provided merely for purpose of illustration, and the actual spring-loaded fastener may vary depending on the embodiment.

Figure 3:
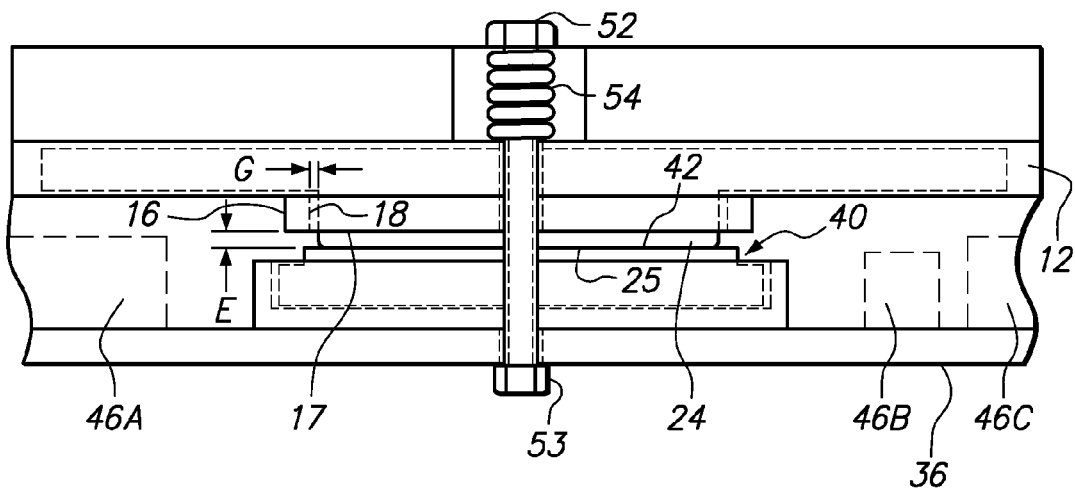
FIG. 3 is a side elevation view of the heat sink assembly loosely secured to the system board.

FIG. 3 is a side elevation view of the heat sink assembly 10 as lightly secured to the system board 30 by the spring-loaded fastening system 50. The externally threaded member has been partially threaded into the internally threaded member 53, such that the surface 25 of the vapor chamber 20 lightly contacts the processor 42 and the spring 54 is partially compressed, but the CPU package 40 is not yet fully seated and the boss 24 remains uncompressed. The uncompressed boss 24 protrudes from the cross-member 16 a distance denoted "E" (for "extension"), which is measured as the distance between the surface 25 of the uncompressed boss 24 and the surface 17 of the cross-member 16. The window 18 in the cross-member 16 is sized to create a slight gap (denoted "G") between the window 18 and the boss 24. The slight gap G is uniform about the boss 24 and will allow the boss 24 to deform slightly outwardly upon compression of the boss 24. The window 18 will help contain the boss 24 and limit outward deformation of the boss 24.

Additional system board components 46A, 46B, and 46C are shown by way of example. The positioning of these additional system board components 46A, 46B, and 46C is made possible by the extra clearance between the frame 12 and the system board 30 resulting from the omission of an ILM or other secondary retention structure. The extra clearance allows the system board components 46A-C to easily fit between the frame 12 and the system board 30, rather than being located radially outward of the area of the heat sink assembly 10 projected onto the system board 30. The extra clearance is particularly desirable in view of the increasingly high-density of modern system board architectures.

Figure 4:
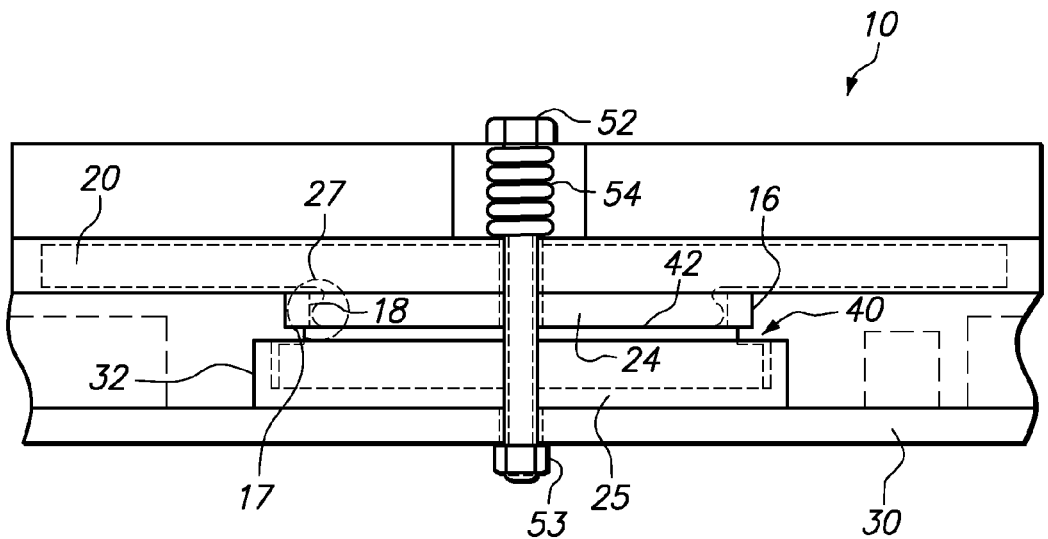
FIG. 4 is a side elevation view of the heat sink assembly as fully secured to the system board.

FIG. 4 is a side elevation view of the heat sink assembly 10 as fully secured to the system board 30, with the spring-loaded fastening system 50 fully tightened. Thus, the externally threaded member 52 has been threadably engaged with the internally threaded member 53 to fully compress the spring 54 (i.e. with neighboring spring coils touching). The spring-loaded fastening system 50 generates sufficient force between the heat sink assembly 10 and the socket 32 to compress and maintain compression of the boss 24 flush with the lower surface 17 of the cross-member 16, and to engage the cross-member 16 with the CPU package 40 to seat the CPU package 40, without the use of an ILM or other secondary retention structure. By applying some of the force required to fully seat the CPU package 40, the structural cross-member 16 reduces the likelihood of the boss 24 rupturing or otherwise failing, even when the force required to compress the boss 24 and seat the CPU package 40 would otherwise cause the boss 24 to rupture or fail if applied solely by the boss 24 without the cross-member 16 and the reinforcing action of the window 18. In some applications, other fasteners may be used in lieu of the spring-loaded fastening system 50, or the spring-loaded fastening system may be used to supplement the force required to compress the boss 24 and seat the CPU package 40.

The profile of the deformed boss 24 at compression locations 27 is exaggerated for purposes of illustration. The actual profile of the deformed boss 24 may depend on a number of factors, such as the wall thickness of the copper vapor chamber 20, the overall height of the boss 24, the distance E that the boss 24 protrudes beyond the cross-member 16 prior to compression (see FIG. 3), and the amount of clearance or gap G between the boss 24 and the window 18 (also see FIG. 3). The compressed boss 24 deforms slightly outwardly into contact with the window 18, and is reinforced on all four side of the square boss 24 against the outward deformation by the window 18 provided on the structural cross-member 16. Reinforcing the boss 24 with the window 18 reduces the likelihood of rupturing the relatively fragile copper sidewall of the vapor chamber 20. The gap G may be selected to provide sufficient reinforcement, while being sufficiently larger to allow the boss 24 to compress more easily before making contact with the window 18. The gap G is uniform on all four sides of the boss 24, so that all four sides of the boss 24 may deform equally.

The boss 24 and window 18 are not required to be square. For example, another embodiment may include a cross-member having a rectangular or circular boss, with a similarly-shaped window for closely receiving the boss. The opening in the structural cross-member through which the boss protrudes is not required to be a window that fully and closely surrounds the boss. For example, the cross-member may alternatively comprise parallel rails supported on the heat sink frame across the exterior surface of the vapor chamber, with only opposite sides of the boss being supported. However, a window that closely surrounds the boss along the full perimeter of the boss, as in the embodiment of FIGS. 1-4, generally provides better reinforcement against deformation and failure of the boss than would be provided by an opening that does not closely surround the boss along the full perimeter of the boss.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heat sink assembly, comprising:
   a vapor chamber having a vapor chamber wall defining a closed volume for containing a volatile liquid, the vapor chamber wall including an outwardly protruding and deformable boss;
   a frame surrounding a perimeter of the vapor chamber;
   a plurality of heat sink fins extending from the frame;
   a cross-member secured to the frame to span an exterior surface of the vapor chamber, the cross-member defining an opening through which the boss of the vapor chamber wall protrudes to at least slightly beyond a lower surface of the cross-member; and
   a fastener coupled to move the frame, the vapor chamber and the boss thereon towards a heat-generating processor to compress the boss to a configuration flush with the lower surface of the cross-member without rupturing.

2. The heat sink assembly of claim 1, further comprising:
   a circuit board;
   a processor socket electrically and mechanically coupled to the circuit board to removably receive the processor; and
   wherein the fastener is configured to secure the frame to the circuit board with the compressed boss in thermally conducting contact with the processor, the fastener providing sufficient force between the frame and the processor socket to seat the processor in the processor socket and to compress the boss to the configuration flush with the lower surface of the cross-member.

3. The heat sink assembly of claim 2, wherein the opening comprises a window through the cross-member, wherein the window closely surrounds a perimeter of the boss with a uniform gap between the perimeter of the boss and the window.

4. The heat sink assembly of claim 3, wherein the boss and the window are sized so that the boss outwardly deforms to engage the window when the boss is compressed flush with the cross-member.

5. The heat sink assembly of claim 2, wherein a substantial portion of the force applied by the fastener after compression of the boss to the configuration flush with the lower surface of the cross-member is supported by the cross-member.

6. The heat sink assembly of claim 2, further comprising:
   one or more electronic components secured to the circuit board between the frame and the circuit board within an area of the frame projected onto the circuit board.

7. The heat sink assembly of claim 1, wherein the outer wall of the vapor chamber comprises a first material and the frame comprises a second material.

8. The heat sink assembly of claim 7, wherein the cross-member also comprises the second material.

9. The heat sink assembly of claim 7, wherein the first material is copper and the second material is aluminum.

10. The heat sink assembly of claim 7, wherein the second material has at least twice the strength and twice the stiffness of the first material.

11. The heat sink assembly of claim 1, wherein the fastener comprises a spring-loaded fastening system.

12. The heat sink assembly of claim 11, wherein the spring-loaded fastening system comprises a male threaded member and a female threaded member threadedly engageable with one another to generate a force sufficient to seat the processor in the processor socket and compress the boss flush with the cross-member.

13. A method, comprising:
providing a heat sink having a vapor chamber with an outwardly protruding boss, a frame surrounding a perimeter of the vapor chamber, a plurality of heat sink fins extending from the frame, and a cross-member secured to span across an exterior surface of the vapor chamber, the cross-member defining an opening through which the boss protrudes at least slightly beyond a lower surface of the cross-member;
removably positioning a processor in a socket on a circuit board, the socket configured for placing the circuit board in electronic communication with the processor when the processor is fully seated in the socket; and
securing the frame to the socket with the boss in contact with the processor using a fastener to apply force to fully seat the processor in the socket and compress the boss to a configuration flush with the lower surface of the cross-member.

14. The method of claim 13, further comprising:
engaging the cross-member with the processor upon compressing the boss to the configuration flush with the lower surface of the cross-member.

15. The method of claim 14, further comprising:
using the cross-member to bear a substantial portion of the force applied by the fastener to the frame after compression of the boss to the configuration flush with the lower surface of the cross-member.

16. The method of claim 14, further comprising:
securing one or more electronic components to the circuit board between the frame and the circuit board within an area of the frame projected onto the circuit board.

17. The method of claim 14, further comprising:
reinforcing the boss by compressing the boss and simultaneously resisting outward deformation of the boss using the opening in the cross-member.

\* \* \* \* \*